(12) United States Patent
Sumida

(10) Patent No.: US 12,127,359 B2
(45) Date of Patent: Oct. 22, 2024

(54) ELECTRONIC UNIT

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Tatsuya Sumida, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/754,700

(22) PCT Filed: Sep. 2, 2020

(86) PCT No.: PCT/JP2020/033196
§ 371 (c)(1),
(2) Date: Apr. 8, 2022

(87) PCT Pub. No.: WO2021/070522
PCT Pub. Date: Apr. 15, 2021

(65) Prior Publication Data
US 2024/0074070 A1   Feb. 29, 2024

(30) Foreign Application Priority Data

Oct. 11, 2019   (JP) .................................. 2019-187760

(51) Int. Cl.
*H05K 5/02*   (2006.01)
*H05K 5/03*   (2006.01)

(52) U.S. Cl.
CPC ............. *H05K 5/0217* (2013.01); *H05K 5/03* (2013.01)

(58) Field of Classification Search
CPC ............................... H05K 5/0217; H05K 5/03
(Continued)

(56) References Cited

U.S. PATENT DOCUMENTS

| 11,051,420 B1* | 6/2021 | Uchida | ................ H05K 7/1427 |
| 2005/0105253 A1* | 5/2005 | Sakai | ................... H05K 5/0039 |
| | | | 361/752 |

(Continued)

FOREIGN PATENT DOCUMENTS

| JP | 2003-258454 A | 9/2003 | |
| JP | 2014209639 A | * 11/2014 | ............... H05K 5/06 |

(Continued)

OTHER PUBLICATIONS

International Search Report, Application No. PCT/JP2020/033196, mailed Nov. 17, 2020. ISA/Japan Patent Office.

*Primary Examiner* — Hung S. Bui
(74) *Attorney, Agent, or Firm* — Honigman, LLP

(57) ABSTRACT

An object is to provide a technique capable of increasing waterproofness of an electronic unit. An electronic unit includes: a case including an opening; a circuit board housed in the case through the opening; and a cover attached to the opening, wherein a protruding portion is provided on at least one side wall of the case, and the protruding portion includes a step that causes an opening side portion of the side wall to protrude further outward relative to a rear side portion of the side wall, and is provided so as to extend along the periphery of the opening.

7 Claims, 8 Drawing Sheets

(58) Field of Classification Search
USPC .......................................................... 361/752
See application file for complete search history.

(56) References Cited

U.S. PATENT DOCUMENTS

| | | | |
|---|---|---|---|
| 2014/0080329 A1* | 3/2014 | Yamanaka | H05K 7/14 |
| | | | 439/76.1 |
| 2015/0077956 A1 | 3/2015 | Sano | |
| 2017/0257959 A1 | 9/2017 | Ogitani | |
| 2019/0297737 A1* | 9/2019 | Kawamura | H01R 13/50 |
| 2019/0380215 A1* | 12/2019 | Tsujiya | H05K 5/0039 |
| 2021/0104879 A1* | 4/2021 | Kobayashi | H02G 3/16 |
| 2022/0295656 A1* | 9/2022 | Uchida | H05K 5/0221 |

FOREIGN PATENT DOCUMENTS

| JP | 2015-185625 A | 10/2015 |
|---|---|---|
| JP | 2017-123417 A | 7/2017 |
| JP | 2019-071376 A | 5/2019 |

* cited by examiner

ELECTRONIC UNIT

CROSS-REFERENCE TO RELATED APPLICATIONS

This application is the U.S. national stage of PCT/JP2020/033196 filed on Sep. 2, 2020, which claims priority of Japanese Patent Application No. JP 2019-187760 filed on Oct. 11, 2019, the contents of which are incorporated herein.

TECHNICAL FIELD

The present disclosure relates to an electronic unit.

BACKGROUND ART

JP 2019-71376A discloses a vehicle control device in which an electronic circuit board is housed in a case member and a cover member is attached to the case member. In JP 2019-71376A, by providing a flange portion around the cover member, a simple waterproof structure is applied to the vehicle control device.

However, in the technique disclosed in JP 2019-71376A, water flowing along the outer surface of the case member may enter a gap between the case member and the cover member.

Accordingly, an object of the present invention is to provide a technique capable of increasing waterproofness of an electronic unit.

SUMMARY

An electronic unit according to the present disclosure includes: a case including an opening; a circuit board housed in the case through the opening; and a cover attached to the opening, wherein a protruding portion is provided on at least one side wall of the case, and the protruding portion includes a step that causes an opening side portion of the side wall to protrude further outward relative to a rear side portion of the side wall, and is provided so as to extend along a periphery of the opening.

Advantageous Effects of Invention

According to the present disclosure, it is possible to increase waterproofness of an electronic unit.

DETAILED DESCRIPTION OF PREFERRED EMBODIMENTS

Figure 1:
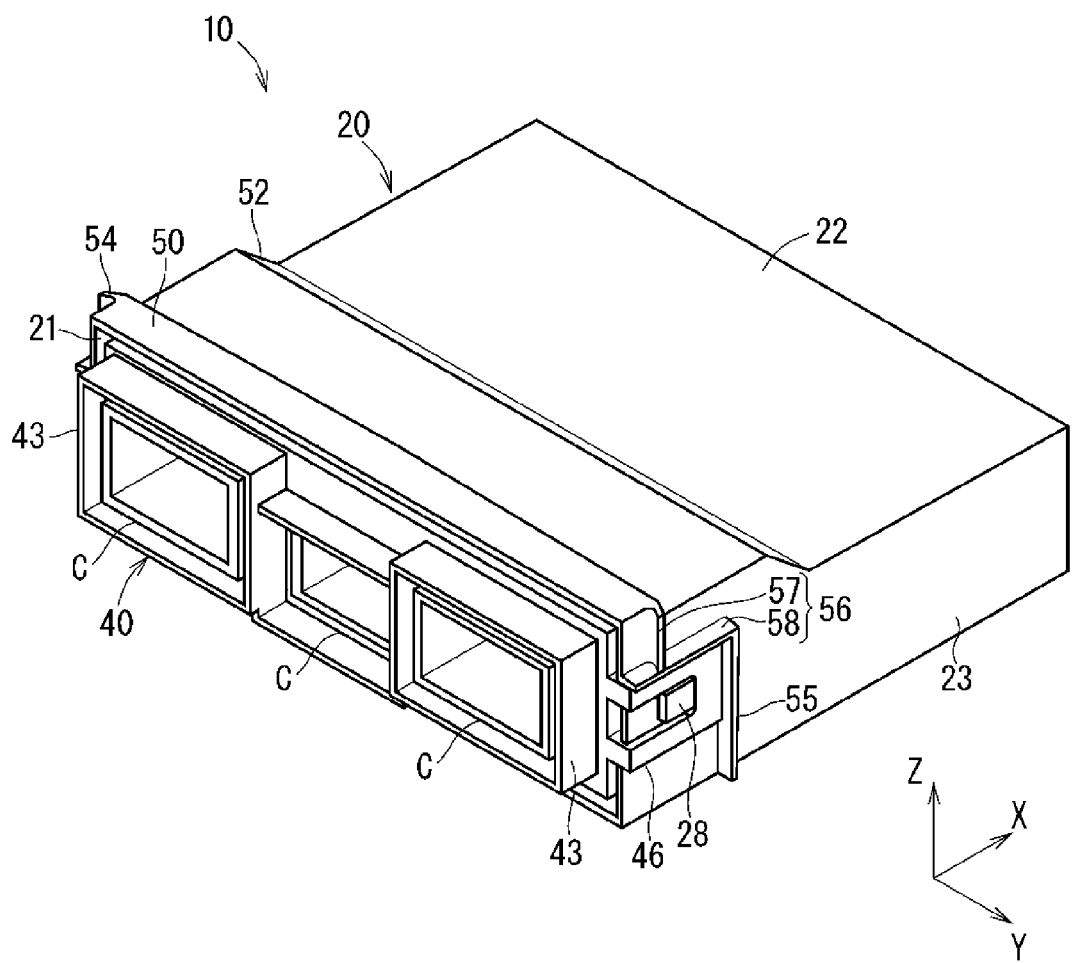
FIG. 1 is a perspective view showing an electronic unit according to an embodiment.

First, embodiments of the present disclosure will be listed and described.

An electronic unit according to the present disclosure is described as follows.

An electronic unit includes: a case having an opening; a circuit board housed in the case through the opening; and a cover attached to the opening, wherein a protruding portion is provided on at least one side wall of the case, and the protruding portion includes a step that causes an opening side portion of the side wall to protrude further outward relative to a rear side portion of the side wall, and is provided so as to extend along the periphery of the opening. Because the protruding portion is formed on the side wall of the case, water flowing along the side wall of the case is blocked by the protruding portion, and the water is less likely to reach a gap between the case and the cover.

In the at least one side wall of the case, a plurality of the protruding portions may be provided from the rear side portion toward the opening side portion. Because the plurality of protruding portions are provided on the side wall of the case, water flowing along the side wall of the case is likely to be blocked by the protruding portions.

The protruding portion may be provided on three or more side walls of the case. With this configuration, regardless of whether the case is disposed vertically or horizontally, the protruding portion can be positioned on the side wall serving as the upper surface.

The case may include a first side wall and a second side wall that are continuous with each other, a locking portion configured to lock the cover may be provided on the second side wall, the protruding portion provided on the second side wall may include a first band-shaped protruding portion formed in a band shape, and the first band-shaped protruding portion may extend along a circumferential direction of the opening at a portion farther from the opening relative to the locking portion. With this configuration, water is less likely to reach the locking portion. As a result, it is possible to prevent water from entering from the gap in the locking portion.

The first band-shaped protruding portion may be provided so as to protrude more outward from the second side wall relative to the locking portion. With this configuration, water is less likely to reach the locking portion.

The protruding portion provided on the first side wall may include an opening-side protruding portion provided at a position closer to the opening relative to the first band-shaped protruding portion, and the protruding portion provided on the second side wall may further include a second band-shaped protruding portion connecting the opening-side protruding portion and the first band-shaped protruding portion. With this configuration, the protruding portion provided on the first side wall can be positioned close to the opening.

The first band-shaped protruding portion and the second band-shaped protruding portion may partition the second side wall into an opening-side region and a rear-side region, surfaces of the first band-shaped protruding portion and the second band-shaped protruding portion that face a rear-side region side may be inclined surfaces, and the inclined surfaces may be inclined from a proximal end connected to the second side wall toward a distal end so as to be separated from the rear-side region. With this configuration, when the electronic unit is disposed such that the first side wall faces upward in the vertical direction, water is likely to flow along the inclined surfaces.

Specific examples of the electronic unit according to the present disclosure will be described below with reference to the drawings. The present disclosure is not limited to these examples, but is indicated by the scope of claims and is intended to include all modifications within the meaning and range equivalent to the scope of claims.

Embodiment

Figure 2:
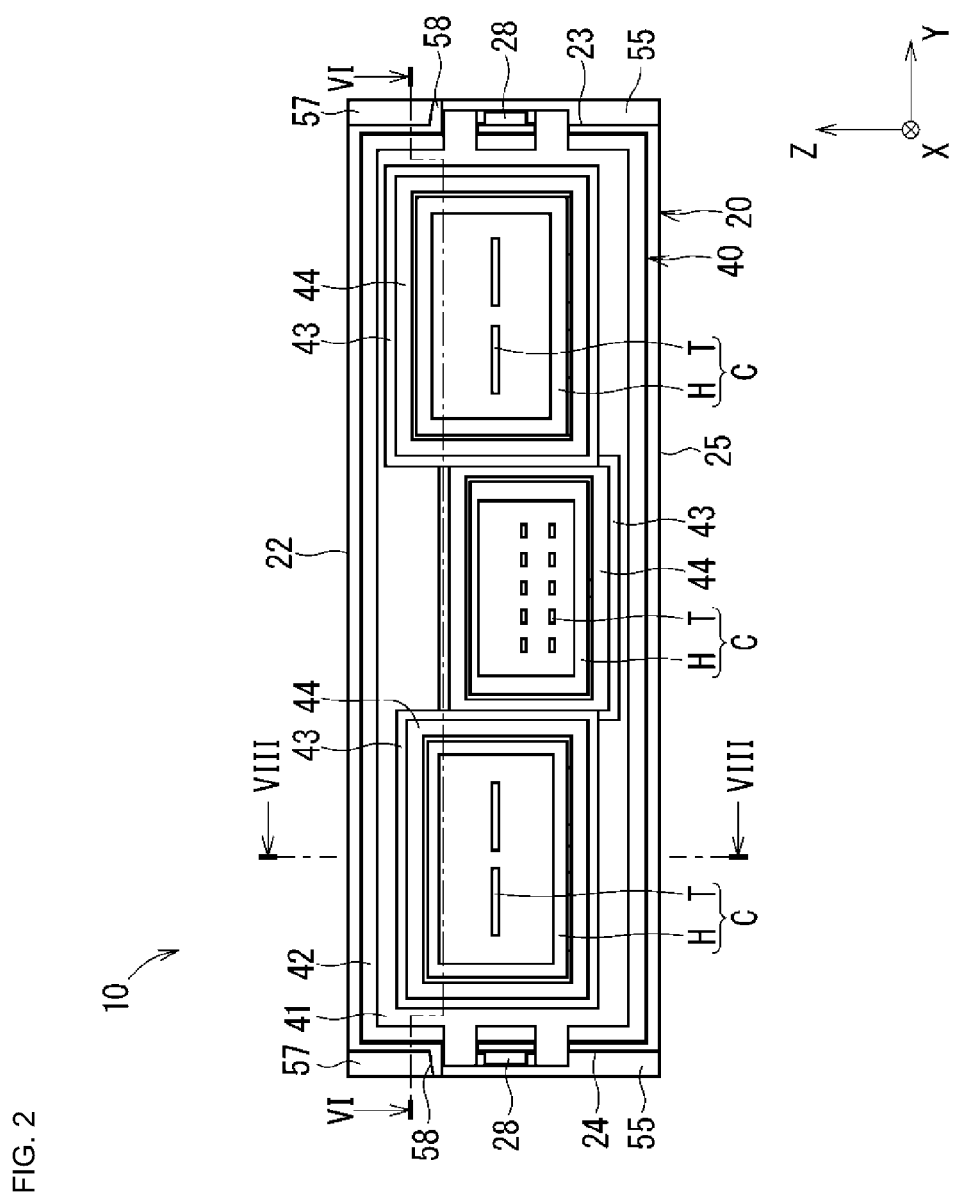
FIG. 2 is a front view showing the electronic unit according to the embodiment.
Figure 3:
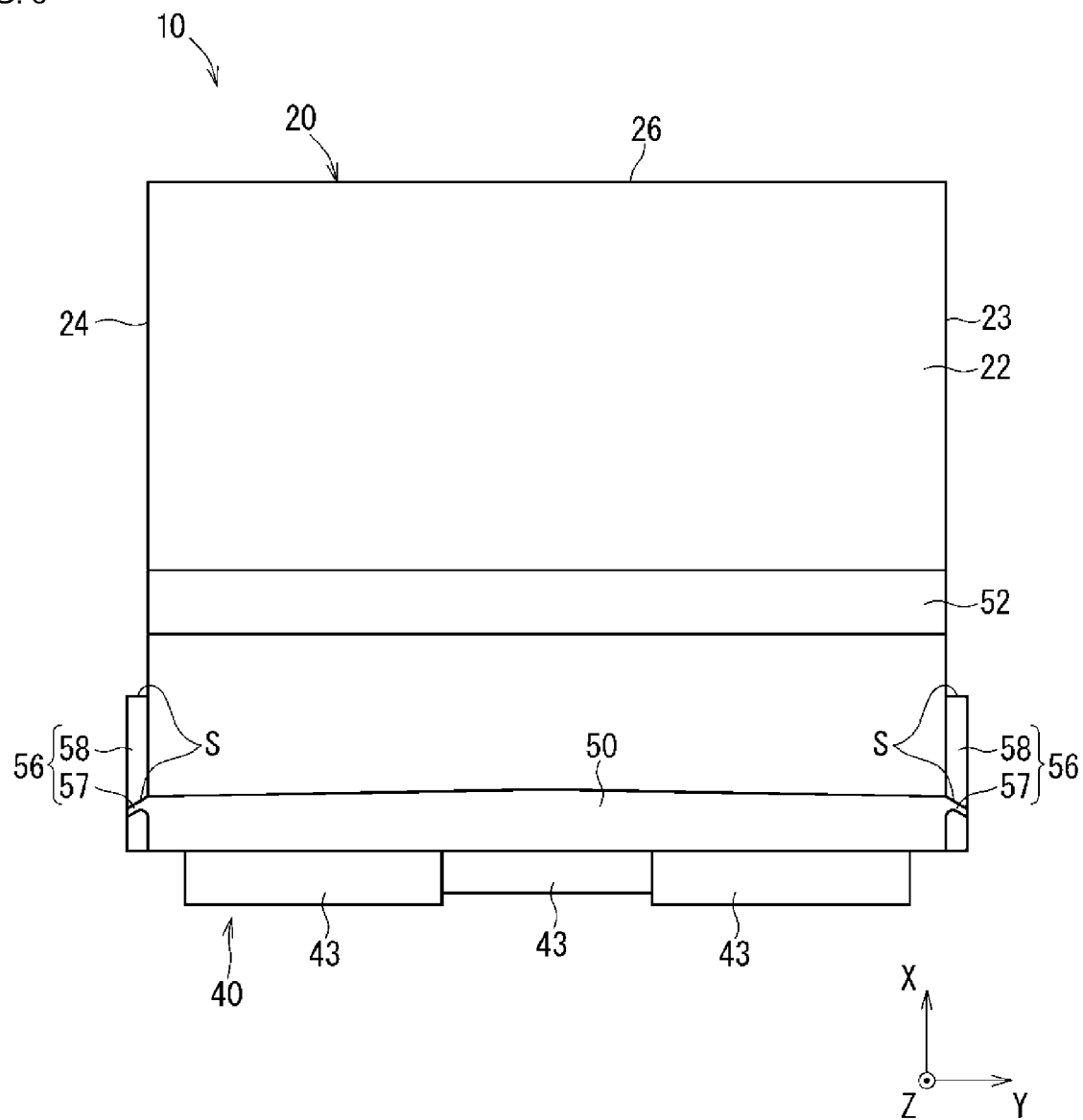
FIG. 3 is a plan view showing the electronic unit according to the embodiment.
Figure 4:
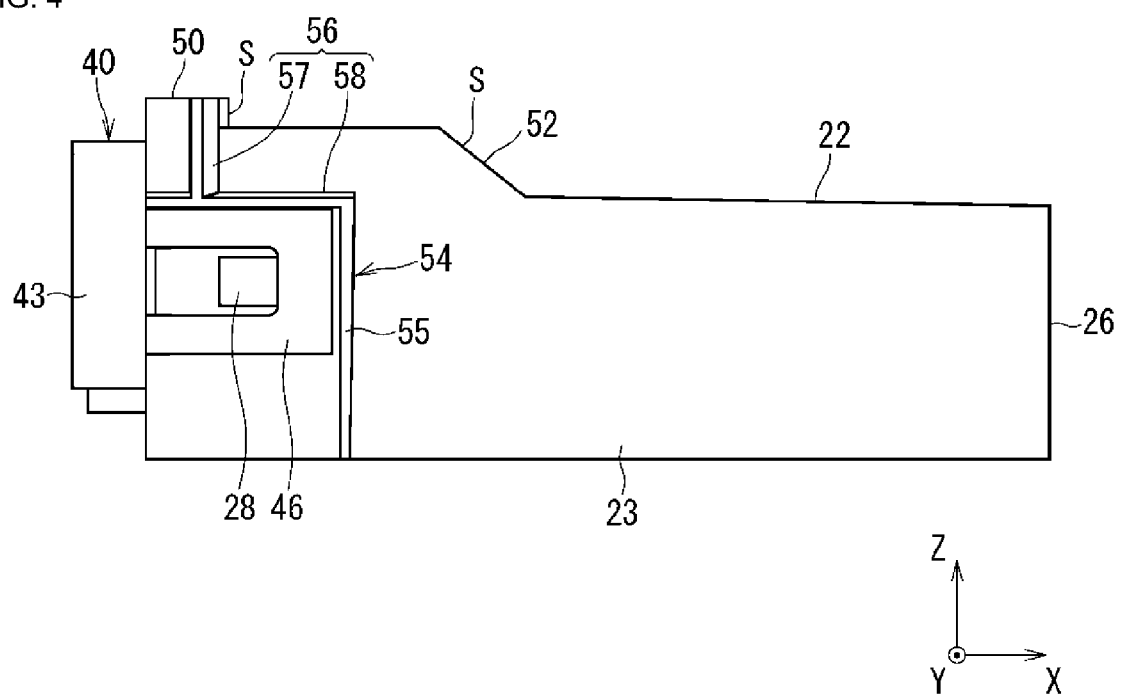
FIG. 4 is a side view showing the electronic unit according to the embodiment.
Figure 5:
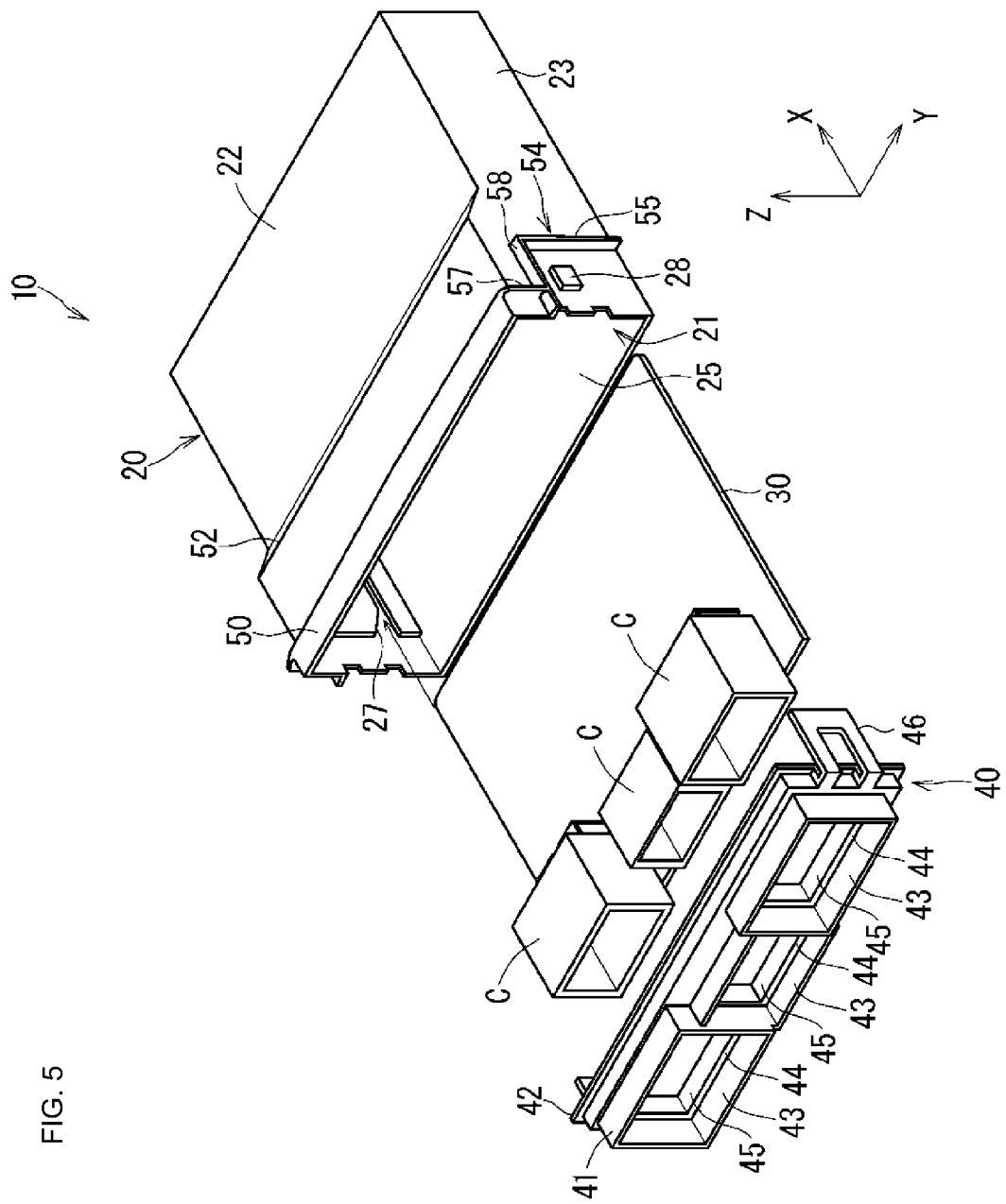
FIG. 5 is an exploded perspective view showing the electronic unit according to the embodiment.
Figure 6:
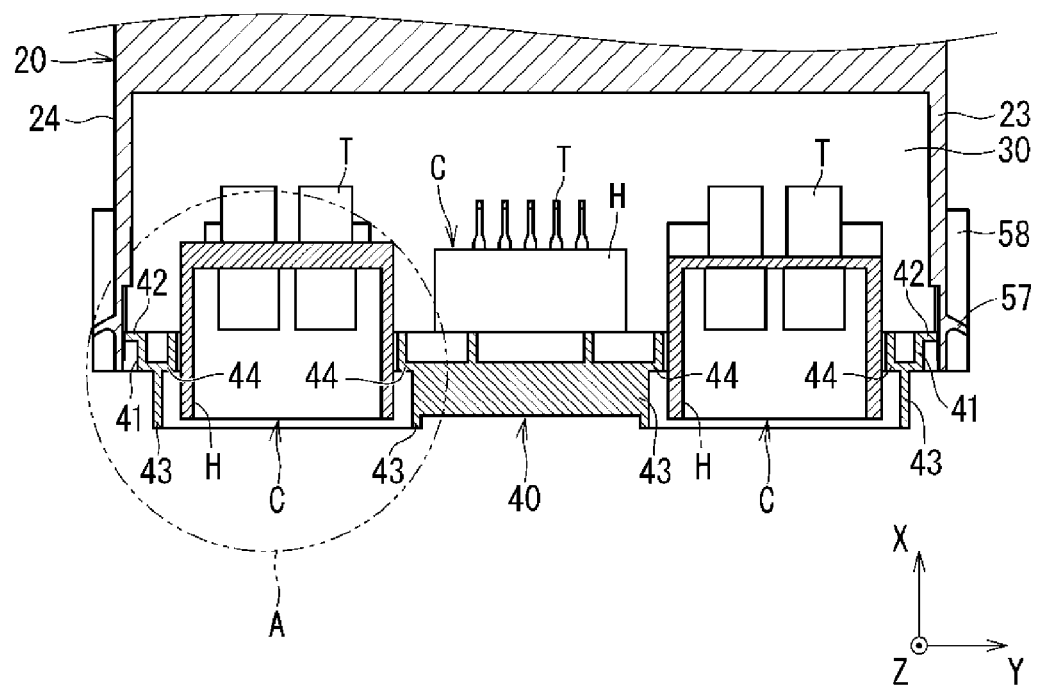
FIG. 6 is a cross-sectional view taking along line VI-VI of FIG. 2.
Figure 7:
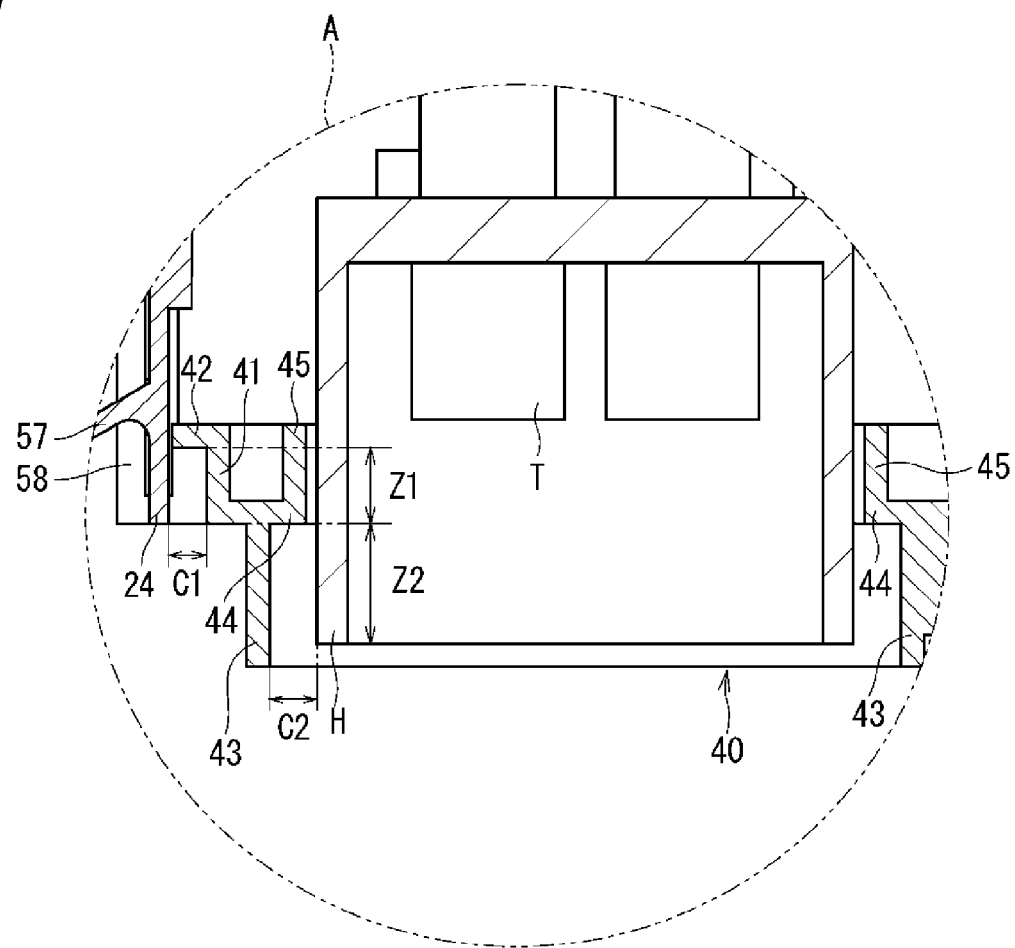
FIG. 7 is an enlarged view of a region A in FIG. 6.
Figure 7:
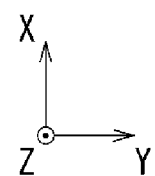
Figure 8:
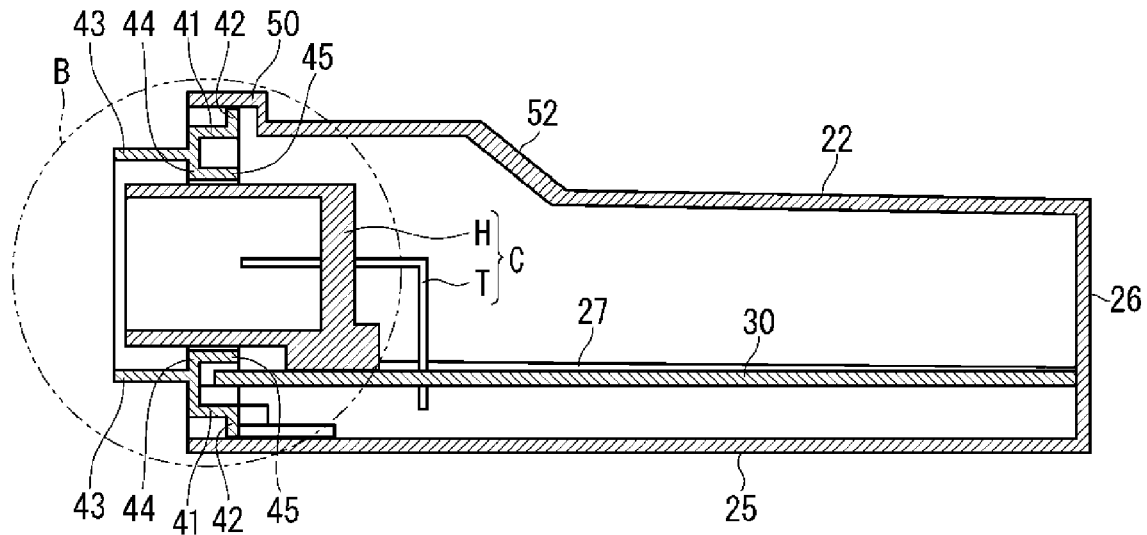
FIG. 8 is a cross-sectional view taking along line VIII-VIII of FIG. 2.
Figure 9:
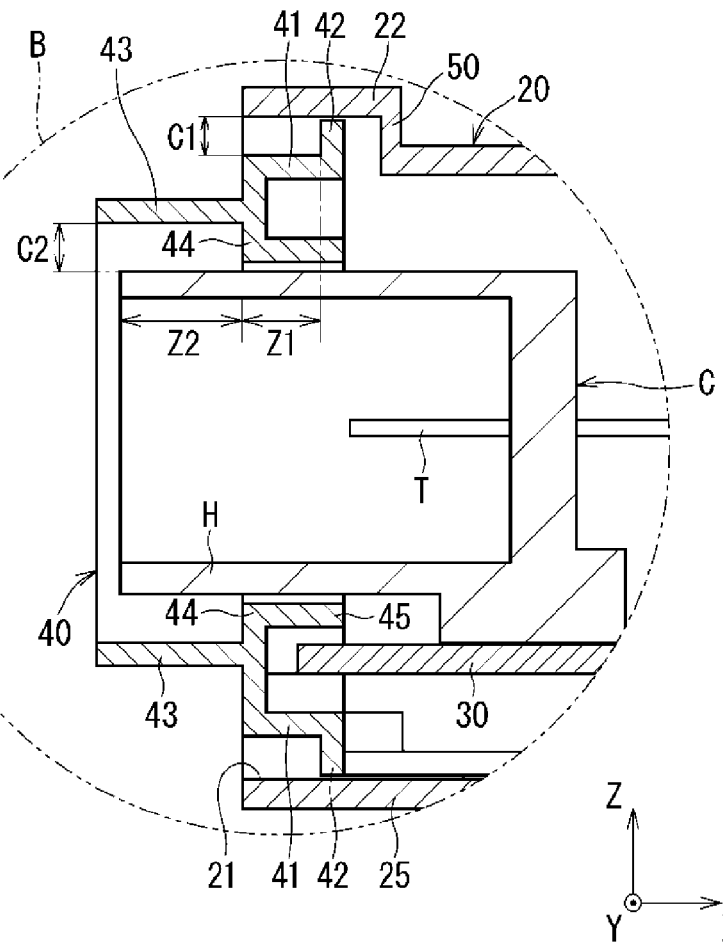
FIG. 9 is an enlarged view of a region B in FIG. 8.

Hereinafter, an electronic unit according to an embodiment will be described. FIG. 1 is a perspective view showing an electronic unit 10 according to the embodiment. FIG. 2 is a front view showing the electronic unit 10 according to the embodiment. FIG. 3 is a plan view showing the electronic unit 10 according to the embodiment. FIG. 4 is a side view showing the electronic unit 10 according to the embodiment. FIG. 5 is an exploded perspective view showing the electronic unit 10 according to the embodiment. FIG. 6 is a cross-sectional view taking along line VI-VI of FIG. 2. FIG. 7 is an enlarged view of a region A in FIG. 6. FIG. 8 is a cross-sectional view taking along line VIII-VIII of FIG. 2. FIG. 9 is an enlarged view of a region B in FIG. 8.

The electronic unit 10 includes a case 20, a circuit board 30, and a cover 40. The electronic unit 10 is used, for example, as an electronic control unit. The electronic unit 10 is installed in a vehicle or the like. It is assumed that the electronic unit 10 is disposed in a place where it is relatively unlikely to be splashed with water, for example, in a vehicle interior.

The case 20 includes an opening 21. The case 20 is formed in a rectangular parallelepiped box shape. A portion corresponding to one surface of six surfaces of the rectangular parallelepiped is the opening 21. Of six surfaces of the rectangular parallelepiped, four surfaces surrounding the opening 21 are side walls 22, 23, 24, and 25. The side wall 22 corresponds to a first side wall 22. The side walls 23 and 24 correspond to second side walls 23 and 24. Of the six surfaces of the rectangular parallelepiped, the surface located on the opposite side to the opening 21 is a bottom wall 26. Hereinafter, in this specification, a direction connecting the opening 21 and the bottom wall 26 is referred to as an X direction. The X direction is an insertion direction of a circuit board 30. Two directions orthogonal to the X direction are referred to as a Y direction and a Z direction. The Y direction extends parallel to the side walls 22 and 25. The Z direction extends parallel to the side walls 23 and 24.

The circuit board 30 is housed in the case 20 through the opening 21. Electronic components may be mounted on the circuit board 30. The circuit board may have one, two, or three or more layers. Connectors C are provided on the circuit board 30. The entirety of the circuit board 30 extending along the X direction is housed in the case 20.

Each connector C includes a connector housing H and terminals T. The connector housing H is mounted on the circuit board 30. A part of the connector housing H protrudes outward from the circuit board 30 along the X direction. A part of the connector housing H protrudes outward from the case 20 along the X direction. A mating connector is to be connected to the protrusion portion. A recessed portion is formed in the protrusion portion. The mating connector is to be inserted into the recessed portion. One end portion of each of the terminals T is connected to a circuit formed on the circuit board 30. The other end portion of each of the terminals T protrudes into a recessed portion. In a state in which the mating connector is inserted into the recessed portion, the other end portions of the terminals T are connected to mating terminals provided on the mating connector.

A positioning portion for positioning the circuit board 30 may be provided on the inner surface of the case 20. In FIG. 5, for example, guide portions 27 are illustrated as the positioning portions. The guide portions 27 are formed on inner surfaces of the side walls 23 and 24, respectively. Each guide portion 27 is formed in a groove shape that extends in the X direction. The circuit board 30 that is inserted into the case 20 from the opening 21 is guided by the guide portions 27, and housed in the case 20. In a state where the circuit board 30 is housed in the case 20, the guide portions 27 are formed so as to support the side edges of the circuit board 30. Alternatively, as a positioning portion, a protruding portion may be provided on one of the inner surface of the case 20 and the circuit board 30, and a recessed portion into which the protruding portion is to be fitted may be provided on the other of the inner surface of the case 20 and the circuit board 30.

Locking portions 28 for locking the cover 40 are provided on the outer surface of the case 20. In this embodiment, the locking portions 28 are provided on the outer surfaces of the side walls 23 and 24, respectively. The locking portions 28 are each formed in a protruding shape respectively protruding from the outer surfaces of the side walls 23 and 24. The cover 40 is hooked and locked to the locking portions 28.

The cover 40 is attached to the opening 21. The cover 40 includes a frame portion 41, an outward flange 42, hoods 43, and inward flanges 44. The cover 40 further includes ribs 45 and locking pieces 46.

The frame portion 41 is inserted into the case 20 through the opening 21. The frame portion 41 is formed in a shape that matches the inner peripheral surface of a peripheral edge portion of the opening 21. Because the side walls 22, 23, 24, and 25 serve as the peripheral edge portions of the opening 21, the frame portion 41 is formed in a rectangular parallelepiped tubular shape that corresponds to the inner surface shape formed by the side walls 22, 23, 24, and 25. The outer surface of the frame portion 41 is provided so as to face the inner surfaces of the side walls 22, 23, 24, and 25 with a gap therebetween.

The outward flange 42 protrudes from the frame portion 41 toward the inner surface of the case 20. The outward flange 42 is connected to one end portion of the frame portion 41 located on the rear side of the case 20. The outward flange 42 closes off the gap between the frame portion 41 and the case 20.

The hoods 43 are formed so as to surround the respective connector housings H. In this example, three connectors C are provided. Three hoods 43 are also provided so as to surround the three connector housings H. Each hood 43 is connected to the other end portion of the frame portion 41. The hoods 43 protrude from the frame portion 41 to the outside of the case 20 along the X direction. Each hood 43 has an inner surface that corresponds to the outer surface of the connector housing H. Here, because the outer surface of each connector housing H is formed in a rectangular shape, the hoods 43 are formed in a rectangular parallelepiped tubular shape. One end of each hood 43 protrudes outward from the connector housing H along the X direction.

The inward flanges 44 protrude from the hoods 43 toward the outer surfaces of the connector housings H. Each inward flange 44 is connected to an end portion of the hood 43 located on the rear side of the case 20. Portions connecting the frame portion 41 and the hoods 43 are provided on the opposite sides of the inward flanges 44 with respect to the hoods 43. The frame portion 41 is connected to extended portions of the inward flanges 44. The ribs 45 are provided at end portions of the inward flanges 44, respectively. The inward flanges 44 close off gaps between the hoods 43 and the connector housings H.

The ribs 45 protrude from the distal end portions of the inward flanges 44 toward the rear side of the case 20. The ribs 45 surround the connector housings H, respectively. Furthermore, the ribs 45 are provided so as to face the frame portion 41. Each rib 45 has the same depth as that of the frame portion 41. On the side wall 25 side, an end portion of the circuit board 30 on the opening 21 side is housed between the frame portion 41 and the ribs 45. Holding portions that hold an end portion of the circuit board 30 may be provided between the frame portion 41 and the ribs 45. With this configuration, the end portion of the circuit board 30 on the opening 21 side is supported.

The locking pieces 46 are provided on the outer side of the frame portion 41. The locking pieces 46 protrude from the frame portion 41. Each locking piece 46 includes a first piece and second piece. The first piece protrudes from the frame portion 41 along the Y direction. The second piece protrudes from the distal end of the first piece along the X direction. The second pieces face the side walls 23 and 24, respectively. A locking recessed portion is formed in each second piece. When the locking portions 28 are housed in the locking recessed portions, the locking pieces 46 are hooked and locked to the locking portions 28.

The locking recessed portion is formed in a region spanning from the first piece to an intermediate portion of the second piece. With this configuration, two L-shaped pieces are parallel to each other between the first piece and the intermediate portion of the second piece. Positioning recessed portions for positioning the two L-shaped pieces are formed on the peripheral edge of the opening 21, in the side walls 23 and 24, respectively.

In the electronic unit of the present disclosure, water flowing along the outer surface of the case 20 is prevented from entering the case 20 by protruding portions 50, 52, and 54 provided on the side walls 22, 23, and 24 and the clearances that are set in the cover 40.

Protruding Portions

First, the protruding portions 50, 52, and 54 will be described. The protruding portions 50, 52, and 54 are provided to prevent water from reaching a gap between the cover 40 and the case 20, gaps between the cover 40 and the connector housings H, and the like. In this example, the side wall 22 is provided with a plurality of protruding portions 50 and 52. Also, the side walls 23 and 24 are each provided with the protruding portion 54. The protruding portions 50, 52, and 54 each include a step S that causes corresponding potions of the side walls 22, 23, and 24 on the opening 21 side to protrude outward relative to portions on the rear side thereof. The protruding portions 50, 52, and 54 are provided so as to extend along the periphery of the opening 21.

A plurality of (in this example, two) protruding portions 50 and 52 are provided on the side wall 22 from the rear side portion to the opening 21 side portion. The plurality of protruding portions 50 and 52 are provided at an interval in the X direction. Of the plurality of protruding portions 50 and 52, the protruding portion located closest to the opening 21 is referred to as an opening-side protruding portion 50. In contrast, of the plurality of protruding portions 50 and 52, the protruding portion located farther from the opening 21 than the opening-side protruding portion 50 is referred to as a rear-side protruding portion 52.

In the opening-side protruding portion 50, a shape where the opening 21 side protrudes outward from the step S continues to the opening 21 side along the X direction. An inner surface of a portion of the side wall 22 where the opening-side protruding portion 50 is formed is also stepped. With this configuration, the housing space in the case 20 is increased at the portion where the opening-side protruding portion 50 is formed. The cover 40 is housed in this enlarged housing space. Accordingly, the opening-side protruding portion 50 also has a function of increasing the housing space in the case 20 for housing the cover 40.

Similarly, also, in the rear-side protruding portion 52, a shape where the opening 21 side protrudes outward from the step S continues to the opening 21 side along the X direction. An inner surface of a portion of the side wall 22 where the rear-side protruding portion 52 is formed is also stepped. With this configuration, the housing space in the case 20 is increased at the portion where the rear-side protruding portion 52 is formed. The connector housings H are housed in this enlarged housing space. Accordingly, the rear-side protruding portion 52 also has a function of increasing the housing space in the case 20 for housing the connector housings H.

In the surface of the opening-side protruding portion 50 facing the X direction, the intermediate portion extending in the Y direction protrudes the most in the X direction. The surface of the opening-side protruding portion 50 facing the X direction is inclined so as to gradually approach the opening 21 side from the intermediate portion extending in the Y direction toward the end portions in the Y direction. With this configuration, water that hits the surface of the opening-side protruding portion 50 facing the X direction is likely to be guided to the end portions in the Y direction.

The surface of the opening-side protruding portion 50 facing the X direction is orthogonal to the XY plane. In contrast, the surface of the rear-side protruding portion 52 facing the X direction forms an angle smaller than 90 degrees with respect to the XY plane. Of course, the surface of the opening-side protruding portion 50 facing the X direction may form an angle smaller than 90 degrees with respect to the XY plane. In contrast, the surface of the rear-side protruding portion 52 facing the X direction may be orthogonal to the XY plane.

The protruding portions 54 on the side walls 23 and 24 each have a first band-shaped protruding portion 55 and a second band-shaped protruding portion 56. The first band-shaped protruding portion 55 and the second band-shaped protruding portion 56 are formed in a band shape. The first protruding portion 55 and the second band-shaped protruding portion 56 are formed so as to protrude outward from portions where the first band-shaped protruding portion 55 and the second band-shaped protruding portion 56 are located.

The first band-shaped protruding portion 55 is provided so as to extend along the circumferential direction of the opening 21 at a position farther from the opening 21 than the locking portion 28 is. The first band-shaped protruding portions 55 are provided so as to protrude more outward of the second side walls 23 and 24 than the locking portions 28. The first band-shaped protruding portions 55 are provided so as to protrude more in the Y direction than the locking portions 28. The first band-shaped protruding portions 55 are provided, along the X direction, at positions farther from the opening 21 than the opening-side protruding portion 50 is. In other words, the opening-side protruding portion 50 is provided, along the X direction, at a position closer to the opening 21 than the first band-shaped protruding portions 55 are. The first band-shaped protruding portions 55 extend along the Z direction. One end portion of each of the first band-shaped protruding portions 55 reaches the side wall 25. The other end portions of the first band-shaped protruding portions 55 extend to intermediate portions of the side walls 22 and 23, respectively. The positions of the first band-shaped protruding portions 55 with respect to the side wall 25 along the Z direction of the other end portions are located at positions that are the same as or farther from the position of a portion of the side wall 22 that is farther from the side wall 25 with respect to the rear-side protruding portion 52 that is on the rear side of the rear-side protruding portion 52 with respect to the side wall 25.

The second band-shaped protruding portions 56 connect the opening-side protruding portion 50 and the first band-shaped protruding portions 55. The second band-shaped protruding portions 56 each have a first section 57 and a second section 58.

The first section 57 extends in the Z direction. The first section 57 is provided at a position along the X direction separated from the first band-shaped protruding portion 55. The first section 57 is provided at a position along the X direction close to the opening 21 relative to the first band-shaped protruding portion 55. The first section 57 extends parallel to the first band-shaped protruding portion 55. One end portion of the first section 57 is continuous with the opening-side protruding portion 50. The other end portion of the first section 57 is located at the same position located along the Z direction as the other end portion of the first band-shaped protruding portion 55.

The second section 58 connects the first band-shaped protruding portion 55 and the first section 57. The second section 58 extends in the X direction. One end portion of the second section 58 is continuous with the other end portion of the first band-shaped protruding portion 55. The other end portion of the second section 58 reaches the opening 21. The other end portion of the first section 57 is continuous with an intermediate portion of the second section 58.

The first band-shaped protruding portions 55 and the second band-shaped protruding portions 56 respectively partition the second side walls 23 and 24 into an opening-side region and a rear-side region. The opening-side region is a region on the side where the locking portion 28 is located. The rear-side region is a region on the side continuous with the bottom wall 26. Surfaces of the first band-shaped protruding portion 55 and the second band-shaped protruding portion 56 facing the rear-side region side are inclined surfaces. The inclined surfaces are inclined from the proximal ends connected to the second side walls 23 and 24 toward the distal ends so as to be distanced from the rear-side regions.

Specifically, the surface of the first band-shaped protruding portion 55 facing the rear side (positive side in the X direction) is an inclined surface. In addition, the surface of the first section 57 facing the rear side (positive side in the X direction) is an inclined surface. The inclined surface of the first band-shaped protruding portion 55 and the inclined surface of the first section 57 are inclined toward the negative side in the X direction, as the inclined surfaces protrude from each of the side walls 23 and 24 along the Y direction. The surface of the second section 58 facing the side of the side wall 22 (positive side in the Z direction) is an inclined surface. The inclined surface of the second sections 58 is inclined toward the negative side in the Z direction, as the inclined surface protrudes from each of the side walls 23 and 24 along the Y direction.

Clearances

Next, the clearances will be described. Due to the clearances set in the cover 40, even if water reaches a gap between the cover 40 and the case 20 or a gap between the cover 40 and the connectors C, water is less likely to enter the case 20.

Specifically, in FIGS. 7 and 9, the dimension C1 is a distance between the outer surface of the frame portion 41 and the inner surface of the case 20. The dimension Z1 is a dimension extending along the X direction (depth direction) of a portion where the outer surface of the frame portion 41 and the inner surface of the case 20 face each other. The dimension C1 and the dimension Z1 are determined according to the following Expression (1).

Expression (1)

$$z = \frac{2T\cos\Theta}{\rho g r} \quad (1)$$

Here, Expression (1) is an expression representing a liquid level height when a capillary phenomenon occurs in a circular tube. Z in Expression (1) is a liquid level height (m). T is the surface tension (N/m). $\Theta$ is the contact angle (rad). $\rho$ is the density of the liquid (kg/m3). g is gravity acceleration (m/s2). r is the radius (m) of the circular tube. In Expression (1), the liquid level height Z is inversely proportional to the radius r of the circular tube. T and $\rho$ are values specific for a liquid. $\Theta$ is a value determined by the material forming the circular tube and the liquid. Accordingly, when the types of the material forming the circular tube and the liquid are determined, the variables are only Z and r.

The value of Z1 is set to, for example, a value larger than or equal to the value of Z obtained when the value of one half of C1 is substituted for the value of r in Expression (1). C1 and Z at this time may be determined experimentally. In other words, the value of Z1 is set to a value greater than or equal to the value of Z obtained when experimenting with water and a circular tube having a radius of one half of the value of C1. At this time, the value of Z may be obtained in each of two cases, that is to say, a case where the circular tube is made of the material forming the cover 40 and a case where the circular tube is made of the material forming the case 20. In this case, the value of Z1 may be greater than or equal to the larger value of the two values of Z, greater than or equal to the smaller value of the two values of Z, or greater than or equal to the average value of the two values of Z.

By setting the values of C1 and Z1 in this manner, water that has entered between the outer surface of the frame portion 41 and the inner surface of the case 20 is less likely to enter the case 20, even if a capillary phenomenon occurs.

Furthermore, when a gap between the outer surface of the frame portion 41 and the inner surface of the case 20 is large, there is a possibility that dust, dirt, or the like will enter the case 20 through the gap. However, because the outward flange 42 is provided, dust, dirt, or the like passing through the gap between the outer surface of the frame portion 41 and the inner surface of the case 20 is prevented from entering the case 20. Also, even if a capillary phenomenon occurs, water that has entered between the outer surface of the frame portion 41 and the inner surface of the case 20 is less likely to reach the outward flange 42. For this reason, even in a case where the outward flange 42 is provided as in this example, even if there is a small gap between the outer surface of the outward flange 42 and the inner surface of the case 20, water is less likely to reach the gap, and thus water is less likely to enter the case 20 through the gap.

Similarly, in FIGS. 7 and 9, the dimension C2 is a distance between the inner surface of the hood 43 and the outer surface of the connector housing H. The dimension Z2 is a dimension extending along the X direction (depth direction) of a portion where the inner surface of the hood 43 and the outer surface of the connector housing H face each other. The dimension C2 and the dimension Z2 are also determined according to the above Expression (1).

The value of Z2 is set to, for example, a value larger than or equal to the value of Z obtained when the value of one half of C2 is substituted for the value of r in Expression (1). C2 and Z at this time may be determined experimentally. In other words, the value of Z2 is set to a value greater than or equal to the value of Z obtained when experimenting with a circular tube having a radius of one half of the value of C2. At this time, the value of Z may be obtained in each of two cases, that is to say, a case where the circular tube is made of the material forming the cover 40 and a case where the circular tube is made of the material forming the connector housing H. In this case, the value of Z2 may be greater than or equal to the larger value of the two values of Z, greater than or equal to the smaller value of the two values of Z, or greater than or equal to the average value of the two values of Z.

By setting the values of C2 and Z2 in this manner, water that has entered between the inner surface of the hood 43 and the outer surface of the connector housing H is less likely to enter the case 20, even if a capillary phenomenon occurs.

Furthermore, when a gap between the inner surface of the hood 43 and the outer surface of the connector housing H is large, there is a possibility that dust, dirt, or the like will enter the case 20 through the gap. However, because the inward flange 44 is provided, dust, dirt, or the like passing through the gap between the inner surface of the hood 43 and the outer surface of the connector housing H is prevented from entering the case 20. Also, even if a capillary phenomenon occurs, water that has entered between the inner surface of the hood 43 and the outer surface of the connector housing H is less likely to reach the inward flange 44. For this reason, even in a case where the inward flange 44 is provided as in this example, even if there is a small gap between the outer surface of the inward flange 44 and the outer surface of the connector housing H, water is less likely to reach the gap, and thus water is less likely to enter the case 20 through the gap.

Operations

In a case where the case 20 is disposed in a state in which the side wall 22 faces vertically upward, the flow of water when water is applied to the side wall 22 will be considered.

Water flowing along the outer surface of the side wall 22 may proceed from the rear side toward the opening 21 side. The case 20 may be attached, for example, such that the opening 21 faces slightly downward. In this case, water flowing along the outer surface of the side wall 22 advances from the rear side to the opening 21 side. When the water flowing along the outer surface of the side wall 22 advances from the rear side to the opening 21 side, the water first reaches the rear-side protruding portion 52. At this time, because the step S is provided in the rear-side protruding portion 52, the water is blocked by the step S. Water that has passed over the step S in the rear-side protruding portion 52 reaches the opening-side protruding portion 50. At this time, because the step S is provided in the opening-side protruding portion 50, the water is blocked by the step S.

The steps S provided in the opening-side protruding portion 50 and the rear-side protruding portion 52 are formed so as to extend along the periphery of the opening 21. Accordingly, the water blocked by the steps S proceeds toward the side walls 23 and 24 along the steps S. The water then flows downward along the side walls 23 and 24.

Because each of the side walls 23 and 24 is also provided with a protruding portion 54, the water that has reached the side walls 23 and 24 is blocked by the steps S at the protruding portions 54, and is guided downward. Although the locking portion 28 is located near the protruding portion 54, because the protruding portion 54 protrudes more than the locking portion 28, water is less likely to reach the locking portion 28.

With this configuration, water is less likely to reach the gap between the cover 40 and the case 20 and the gaps between the cover 40 and the connectors C.

Next, a case where some water reaches the gap between the cover 40 and the case 20 and the gaps between the cover 40 and the connectors C will be considered. As described above, the protruding portions 50, 52, and 54 prevent water from reaching the gap between the cover 40 and the case 20 and the gaps between the cover 40 and the connectors C. However, some water may directly reach the gap between the cover 40 and the case 20 and a gap between the cover 40 and the connectors C.

In this case, because the dimension C1 and the dimension Z1 are set to the dimensions according to Expression (1), water is less likely to enter from the gap between the cover 40 and the case 20 to the rear side of the cover 40 of the case 20. Similarly, because the dimension C2 and the dimension Z2 are set to the dimensions according to Expression (1), water is less likely to enter the case 20 from the gaps between the cover 40 and the connector housings H to the rear side with respect to the cover 40.

As described above, with this configuration, water flowing along the outer surface of the case 20 is less likely to enter the case 20.

Effects of Embodiment

According to the electronic unit 10 configured as described above, because the protruding portions 50, 52, and 54 are formed on the side walls 22, 23, and 24 of the case 20, water flowing along the side walls 22, 23, and 24 of the case 20 is blocked by the protruding portions 50, 52, and 54, and thus the water is less likely to reach the gap between the case 20 and the cover 40.

In order to make the electronic unit 10 waterproof, it is conceivable to attach packing or employ a waterproof connector. However, a configuration in this case is expensive and difficult to manufacture. Furthermore, in a place where the risk of water splashing is low, such specifications may be over engineering. In contrast, in the above electronic unit 10, the waterproof properties can be easily provided, and thus the electric unit 10 is effectively disposed in a place where the risk of water splashing is low.

In addition, because the protruding portions 50, 52, and 54 are provided on three or more side walls 22, 23, and 24 of the case 20, any of the protruding portions 50, 52, and 54 can be positioned on the side walls 22, 23, and 24 facing upward in the vertical direction, regardless of whether the case 20 is disposed vertically or horizontally. In other words, even when any one of the side walls 22, 23, and 24 is oriented upward in the vertical direction, any of the protruding portions 50, 52, and 54 can be present.

Also, because the plurality of protruding portions 50 and 52 are provided on the side wall 22 of the case 20, water flowing along the side wall 22 of the case 20 is likely to be blocked by the protruding portions 50 and 52.

Also, because the first band-shaped protruding portions 55 are provided at positions farther from the opening 21 than the locking portions 28 are, water is less likely to reach the locking portions 28. Accordingly, it is possible to prevent water from entering from gaps in the locking portions 28.

Also, because the first band-shaped protruding portions 55 are provided so as to protrude more outward from the second side walls 23 and 24 than the locking portions 28, water is less likely to reach the locking portions 28.

Also, because the opening-side protruding portion 50 and the second band-shaped protruding portions 56 are provided, the step S in the opening-side protruding portion 50 can be located at a position close to the opening 21. Accordingly, even if water is splashed on a portion of the side wall 22 near the opening 21, the water is blocked by the opening-side protruding portion 50.

Also, when the electronic unit 10 is disposed in a vehicle or the like such that the side wall 22 faces upward in the vertical direction, water is likely to flow along the inclined surfaces of the first band-shaped protruding portions 55 and the second band-shaped protruding portions 56. With this configuration, water is likely to flow downward.

MODIFIED EXAMPLES

The protruding portions 50, 52, and 54 are described as being formed on the plurality of side walls 22, 23, and 24 in the embodiment, but this is not an essential configuration. A protruding portion may be formed on only one side wall. A protruding portion may be provided on at least one side wall of the case. Also, a protruding portion may be provided on three or more side walls of the case. It is preferable that three or more of four continuous side walls of the rectangular parallelepiped are provided with a protruding portion.

In the embodiment, the side wall 22 is described as being provided with the plurality of protruding portions 50 and 52, but this is not an essential configuration. The case may not have a side wall that is provided with a plurality of protruding portions. In other words, the number of protruding portions may be one or less on all side walls of the case.

In the embodiment, the protruding portions 54 on the second side walls 23 and 24 are described as having the first band-shaped protruding portion 55 and the second band-shaped protruding portion 56, but this is not an essential configuration. The protruding portions 54 of the second side walls 23 and 24 may be formed in the same shape as the opening-side protruding portion 50 of the first side wall 22.

Also, each of the protruding portions 54 of the second side walls 23 and 24 may include only the first band-shaped protruding portion 55. In this case, the step S of the opening-side protruding portion 50 and the step S of the first band-shaped protruding portion 55 may be located at the same position in the X direction. In addition, each of the second band-shaped protruding portions 56 may not have the first section 57 and the second section 58. For example, the second band-shaped protruding portions may respectively extend on the side walls 23 and 24 so as to connect the opening-side protruding portion 50 and the first band-shaped protruding portions 55 in a straight line.

Also, the first band-shaped protruding portion 55 is described as having a protruding dimension larger than that of the locking portion 28, but this is not an essential configuration. The protruding dimension of the first band-shaped protruding portion 55 may be smaller than or equal to the protruding dimension of the locking portion 28.

It has been described that the inclined surfaces are respectively formed on the first band-shaped protruding portion 55 and the second band-shaped protruding portion 56, but this is not an essential configuration. The inclined surface may not be formed one or both of the first band-shaped protruding portion 55 and the second band-shaped protruding portion 56.

Furthermore, it has been described that the clearances between the cover 40 and the case 20 and the clearances between the cover 40 and the connector housings H are set according to Expression (1), but this is not an essential configuration. The clearances between the cover 40 and the case 20 and the clearances between the cover 40 and the connector housings H may be set independently of Expression (1).

The configurations described in the embodiment and the modified examples can be appropriately combined as long as they do not contradict each other.

The invention claimed is:

1. An electronic unit comprising:
    a case including an opening;
    a circuit board housed in the case through the opening; and
    a cover attached to the opening,
    wherein a protruding portion is provided on three or more side walls of the case and is continuous,
    the protruding portion includes a step that causes an opening side portion of the side wall to protrude further outward relative to a rear side portion of the side wall, and is provided so as to extend along the periphery of the opening,
    wherein the three or more side walls includes a first side wall and a second side wall that are continuous with each other,
    a locking portion configured to lock the cover is provided on the second side wall,
    the first side wall protrudes outward from an outer surface of the cover, and
    the protruding portion includes a protruding portion formed on the first side wall and the second side wall,
    wherein the protruding portion on the second side wall includes a first belt-shaped protruding portion formed in a belt shape, and the first belt-shaped protruding portion extends along a circumferential direction of the opening at a portion farther from the opening relative to the locking portion.

2. An electronic unit according to claim 1, wherein, in the at least one side wall of the case, a plurality of the protruding portions are provided from the rear side portion toward the opening side portion.

3. The electronic unit according to claim 2, wherein the protruding portion provided on the second side wall includes a first belt-shaped protruding portion formed in a belt shape, and
    the first belt-shaped protruding portion extends along a circumferential direction of the opening at a portion farther from the opening relative to the locking portion.

4. The electronic unit according to claim 1, wherein the first belt-shaped protruding portion is provided so as to protrude more outward from the second side wall relative to the locking portion.

5. The electronic unit according to claim 4, wherein the protruding portion provided on the first side wall includes an opening-side protruding portion provided at a position closer to the opening relative to the first belt-shaped protruding portion, and the protruding portion provided on the second side wall further includes a second belt-shaped protruding portion connecting the opening-side protruding portion and the first belt-shaped protruding portion.

6. The electronic unit according to claim 1, wherein the protruding portion provided on the first side wall includes an opening-side protruding portion provided at a position closer to the opening relative to the first belt-shaped protruding portion, and the protruding portion provided on the second side wall further includes a second belt-shaped protruding portion connecting the opening-side protruding portion and the first belt-shaped protruding portion.

7. The electronic unit according to claim 6, wherein the first belt-shaped protruding portion and the second belt-shaped protruding portion partition the second side wall into an opening-side region and a rear-side region, surfaces of the first belt-shaped protruding portion and the second belt-shaped protruding portion that face a rear-side region side are inclined surfaces, and the inclined surfaces are inclined from a proximal end connected to the second side wall toward a distal end so as to be separated from the rear-side region.

* * * * *